(12) United States Patent
Schwarz et al.

(10) Patent No.: US 12,322,675 B2
(45) Date of Patent: Jun. 3, 2025

(54) ELECTRONIC MODULE COMPRISING A PULSATING HEAT PIPE

(71) Applicant: Siemens Aktiengesellschaft, Munich (DE)

(72) Inventors: Florian Schwarz, Bayern (DE); Alexander Hensler, Gerhardshofen (DE); Hubert Schierling, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 57 days.

(21) Appl. No.: 17/777,443

(22) PCT Filed: Sep. 29, 2020

(86) PCT No.: PCT/EP2020/077194
§ 371 (c)(1),
(2) Date: May 17, 2022

(87) PCT Pub. No.: WO2021/099019
PCT Pub. Date: May 27, 2021

(65) Prior Publication Data
US 2022/0406682 A1 Dec. 22, 2022

(30) Foreign Application Priority Data
Nov. 18, 2019 (EP) .................... 19209734

(51) Int. Cl.
*H05K 7/20* (2006.01)
*H01K 1/02* (2006.01)
(Continued)

(52) U.S. Cl.
CPC ......... *H01L 23/427* (2013.01); *H05K 1/0203* (2013.01); *H05K 7/02* (2013.01); *H05K 7/20336* (2013.01); *H05K 2201/064* (2013.01)

(58) Field of Classification Search
CPC ............ H05K 7/20336; H05K 1/0203; H05K 2201/064; H05K 7/02; H01L 23/427
See application file for complete search history.

(56) References Cited

U.S. PATENT DOCUMENTS 4,704,658 A 11/1987 Yokouchi et al.
4,727,454 A * 2/1988 Neidig ................. H01L 23/427
361/689

(Continued)

FOREIGN PATENT DOCUMENTS

CN 201585166 U 9/2010
CN 103000596 A 3/2013
(Continued)

OTHER PUBLICATIONS

Translated First Office Action for CN application No. 202080079868.9 (Feb. 12, 2025).*
(Continued)

*Primary Examiner* — Zachary Pape
(74) *Attorney, Agent, or Firm* — Henry M. Feiereisen LLC

(57) ABSTRACT

An electronic module includes a pulsating heat pipe having a channel structure for arrangement of a heat transport medium. The channel structure is formed of ceramic bodies, a metallic cover element, and a metallic carrier element. An electrical structural element is in contact with the heat transport medium.

17 Claims, 4 Drawing Sheets

(51) Int. Cl.
　　　*H01L 23/427*　　(2006.01)
　　　*H05K 1/02*　　　(2006.01)
　　　*H05K 7/02*　　　(2006.01)

(56) References Cited

U.S. PATENT DOCUMENTS

| | | | |
|---|---|---|---|
| 5,268,812 | A | 12/1993 | Conte |
| 10,436,520 | B2 * | 10/2019 | Kim .................... F28D 15/0233 |
| 11,204,203 | B2 * | 12/2021 | Kim ....................... H01L 23/427 |
| 2014/0174085 | A1 * | 6/2014 | Kare ....................... F01K 25/12 60/670 |
| 2017/0082379 | A1 | 3/2017 | Agostini et al. |
| 2017/0094843 | A1 | 3/2017 | Agostini et al. |
| 2017/0135247 | A1 * | 5/2017 | Ogata ................... F28D 15/025 |
| 2018/0158756 | A1 | 6/2018 | Smoot et al. |

FOREIGN PATENT DOCUMENTS

| | | | | |
|---|---|---|---|---|
| CN | 106922108 | A | | 7/2017 |
| CN | 106971990 | A | | 7/2017 |
| CN | 108627039 | A | | 10/2018 |
| DE | 102018206020 | A1 * | 10/2019 | ............. B64C 11/00 |
| EP | 3336471 | A1 | | 6/2018 |
| JP | 2013120053 | A | | 6/2013 |

OTHER PUBLICATIONS

PCT International Search Report and Written Opinion of International Searching Authority mailed Jan. 22, 2021 corresponding to PCT International Application No. PCT/EP2020/077194 filed Sep. 29, 2020.

\* cited by examiner

ELECTRONIC MODULE COMPRISING A PULSATING HEAT PIPE

CROSS-REFERENCES TO RELATED APPLICATIONS

This application is the U.S. National Stage of International Application No. PCT/EP2020/077194, filed Sep. 29, 2020, which designated the United States and has been published as International Publication No. WO 2021/099019 A1 and which claims the priority of European Patent Application, Serial No. 19209734.3, filed Nov. 18, 2019, pursuant to 35 U.S.C. 119 (a)-(d).

BACKGROUND OF THE INVENTION

The invention relates to an electronic module, which has a pulsating heat pipe.

With the advances in miniaturization in the field of microelectronics, the power density of electronic modules and thus also the heat flux density of heat generated by the electronic modules is increasing. Today, powerful electrical structural elements such as power semiconductors already generate thermal losses with heat flux densities of more than 100 W/cm$^2$, and rising. In order to avoid failures of electronics due to thermal overloads, increasingly more effective concepts for heat dissipation of the electrical structural elements are therefore needed.

US 2018/0158756 A1 discloses an integrated circuit apparatus with at least one semiconductor apparatus arranged on a substrate, wherein the substrate has a pulsating heat pipe embodied therein.

A pulsating heat pipe (PHP), which is also referred to as oscillating heat pipe (OHP), is an apparatus for heat transfer with a closed channel structure, in which a heat transport medium is arranged, which forms steam segments and liquid segments in an alternating manner along the channel structure due to the surface tension of the heat transport medium. These steam and liquid segments are excited to pulsation or oscillation by a temperature gradient. At a heat source, the steam segments expand due to the higher temperature; liquid heat transport medium also boils there and in doing so absorbs latent heat. At a heat sink, the steam segments contract due to condensation of gaseous heat transport medium and in doing so emit latent heat. The local temperature and pressure differences drive the constant pulsation or oscillation of the steam and liquid segments.

The invention is based on the object of specifying an improved electronic module with a pulsating heat pipe.

SUMMARY OF THE INVENTION

The object is achieved according to the invention by an electronic module as set forth hereinafter and by a method for producing an electronic module as set forth hereinafter. Advantageous embodiments of the invention are the subject matter of the subclaims.

An electronic module according to the invention comprises a pulsating heat pipe with a channel structure, in which a heat transport medium is arranged, and at least one electrical structural element, which is in direct contact with the heat transport medium and/or is connected to an electrically conductive contact element that is in direct contact with the heat transport medium.

A pulsating heat pipe has a significantly higher effective thermal conductivity than a solid heat-conducting body of comparable size, for example. A pulsating heat pipe further-more functions independently of its location and in a purely passive manner, meaning that it does not require movable structural parts such as pumps and does not require a power supply. As a result, a pulsating heat pipe has a higher level of operational safety and reliability. Furthermore, a pulsating heat pipe can be designed in a very flat and compact manner, for example with a thickness of at most 3 mm. Due to these properties, a pulsating heat pipe is particularly suitable for heat dissipation of electrical structural elements with a high power density, such as power semiconductors. In an electronic module according to the invention, the heat transport medium of a pulsating heat pipe is in direct contact with at least one electrical structural element and/or with an electrically conductive contact element that is connected to at least one electrical structural element. As a result, the thermal contact of the heat transport medium with the electrical structural element is improved and the heat dissipation from the electrical structural element is increased by the pulsating heat pipe.

In one embodiment of the invention, the pulsating heat pipe is embodied in a plate-like manner. In a further embodiment of the invention, the channel structure has at least one channel running in a meandering manner. In a further embodiment of the invention, the channel structure is embodied in a planar manner. These embodiments of the invention enable a high thermal spreading effect of the pulsating heat pipe due to the pulsating heat pipe or the channel structure thereof being designed over a large area.

In a further embodiment of the invention, the pulsating heat pipe has at least one ceramic body, which forms walls of the channel structure that separate the channel sections of the channel structure from one another. The formation of the channel structure by way of at least one ceramic body advantageously enables the base body of the pulsating heat pipe to be embodied in an electrically insulating manner, with good thermal properties with regard to thermal conductivity and thermal stability of the base body.

In a further embodiment of the invention, the pulsating heat pipe has an electrically conductive cover element, which is in contact with the heat transport medium and on which at least one electrical structural element is arranged and which, at least in a surrounding area of the electrical structural element, closes off the channel structure in the manner of a cover. In this context, by way of the cover element, it is possible to simultaneously implement a high level of thermal spreading and heat transfer to the heat transport medium of the pulsating heat pipe for heat dissipation of an electrical structural element arranged on the cover element and electrical contacting of the electrical structural element. In particular, the pulsating heat pipe with the cover element may form what is known as a DBC structure (DBC=direct bonded copper) for at least one electrical structural element, in which the base body of the pulsating heat pipe acts as substrate and a cover element made of copper acts as electrically conductive structure.

In a further embodiment of the invention, the cover element has, in the region of at least one electrical structural element arranged on it, at least one recess, through which the channel structure of the pulsating heat pipe is connected to a surface of the electrical structural element, meaning that the heat transport medium is in direct contact with the surface of the electrical structural element. A recess of this kind in the cover element advantageously increases the heat transfer from an electrical structural element to the heat transport medium due to the direct contact of the heat transport medium with the electrical structural element.

In a further embodiment of the invention, the cover element is made of a metal, in particular copper, or an alloy. As a result, it is advantageously possible to simultaneously implement an effective thermal and an effective electric conductivity of the cover element.

In a further embodiment of the invention, the pulsating heat pipe has a carrier element, which closes off the channel structure on a side opposite the cover element. In particular, the carrier element may be made of the same material as the cover element. As a result, for example, it is advantageously possible to prevent or reduce a bending of the pulsating heat pipe due to different thermal coefficients of expansion of the cover element and the base body of the pulsating heat pipe.

In a further embodiment of the invention, at least one electrical structural element is arranged in the channel structure of the pulsating heat pipe, meaning that the heat transport medium is able to flow around it. This embodiment of the invention enables a particularly efficient heat dissipation of an electrical component due to the electrical structural element being in contact with the heat transport medium over a large area.

In a further embodiment of the invention, the pulsating heat pipe has a circuit board that closes off at least one region of the channel structure in the manner of a cover and has at least one conductor path, which is electrically connected to an electrical structural element arranged in the channel structure. A circuit board of this kind advantageously enables the electrical contacting of an electrical structural element arranged in the channel structure.

In a further embodiment of the invention, the heat transport medium is an electrically non-conductive fluid, in particular perfluoro-N-alkyl-morpholine. The pulsating heat pipe being embodied with an electrically non-conductive heat transport medium prevents electrical connections of electrical structural elements to one another or to other electrical components by way of the heat transport medium. Due to its high thermal conductivity, its boiling point and its dielectric properties, perfluoro-N-alkyl-morpholine is suitable as heat transport medium of an electronic module according to the invention. An electrically conductive fluid, for example water, acetone or methanol, can only be used as heat transport medium if electrical structural elements are not interconnected by the heat transport medium, for example that is to say if a separate channel of the channel structure is provided for each electrical structural element, which is not connected to the other channels of other electrical structural elements.

In a further embodiment of the invention, at least one electrical structural element is a power semiconductor. This embodiment of the invention takes into consideration that power semiconductors have particularly high power densities and therefore require an especially effective heat dissipation.

In the method according to the invention for producing an electronic module according to the invention, the pulsating heat pipe is filled with the heat transport medium through at least one filling opening once all electrical structural elements have been installed, and each filling opening is closed off after the filling. The method takes into consideration that the pulsating heat pipe possibly may not withstand the high process temperatures during the installation of electrical structural elements, and for this reason is advantageously only filled once all electrical structural elements have been installed. If the pulsating heat pipe has an electrically conductive cover element, each filling opening is preferably embodied in the cover element and is closed off after the filling, for example by soldering or laser welding. This embodiment of the method takes into consideration that a filling opening in the cover element can be hermetically closed off in a simpler manner than, for example, a filling opening in a ceramic body, in which hermetic closing off at moderate temperatures that do not damage the ceramic body represents a challenge.

In a further embodiment of the method according to the invention, the pulsating heat pipe is at least partially produced by 3D printing. In the event that the pulsating heat pipe has at least one ceramic body, for example, each ceramic body is produced by 3D printing. If the pulsating heat pipe has a cover element, then (alternatively or additionally) the cover element may furthermore be produced by 3D printing. This embodiment of the method in particular enables the production of geometrically more complex channel structures, which could not be produced by conventional production methods, or could only be produced with considerable effort.

BRIEF DESCRIPTION OF THE DRAWING

The above-described properties, features and advantages of this invention and the manner in which these are achieved will become more clearly and easily intelligible in connection with the following description of exemplary embodiments, which are explained in further detail with reference to the drawings, in which.

DETAILED DESCRIPTION OF PREFERRED EMBODIMENTS

Figure 1:
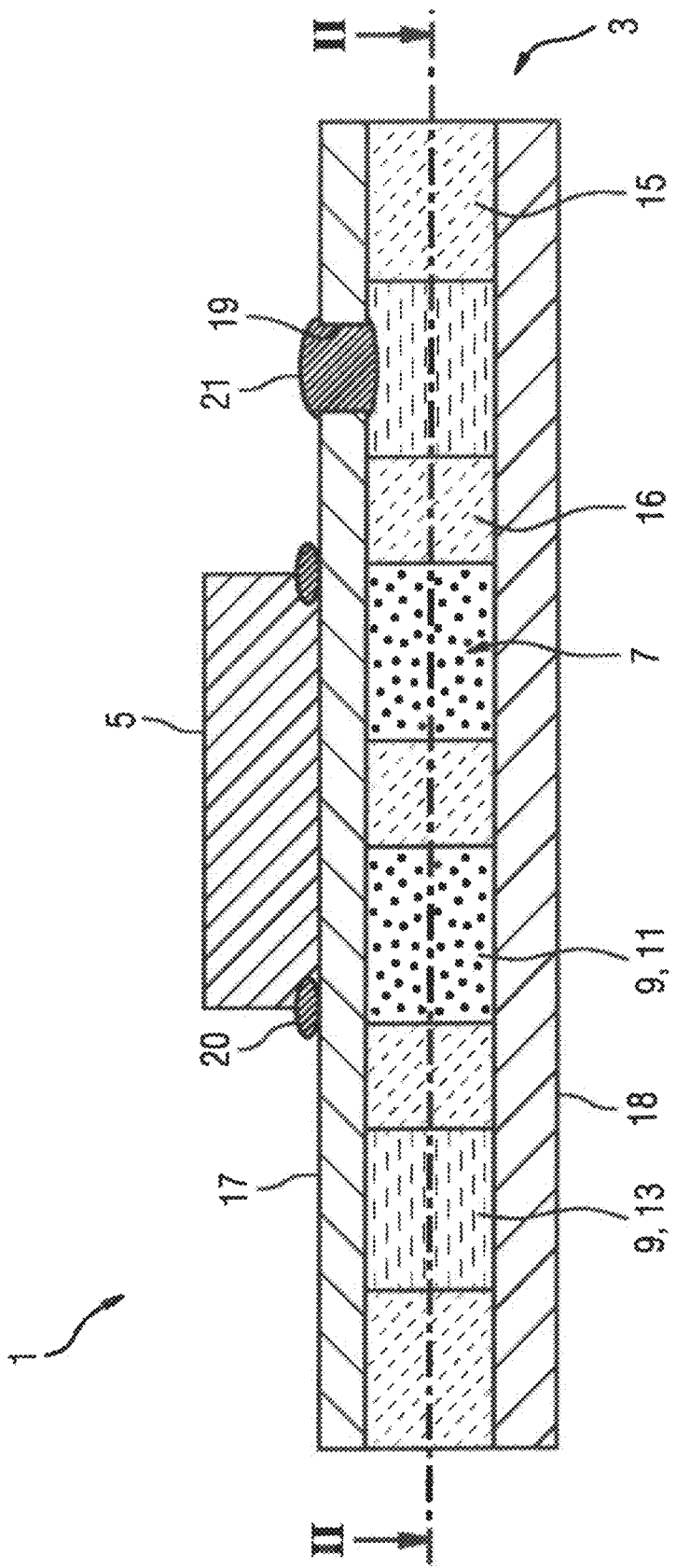
FIG. 1 shows a first exemplary embodiment of an electronic module in a first sectional representation.

Parts which correspond to one another are provided with the same reference characters in the figures.

Figure 2:
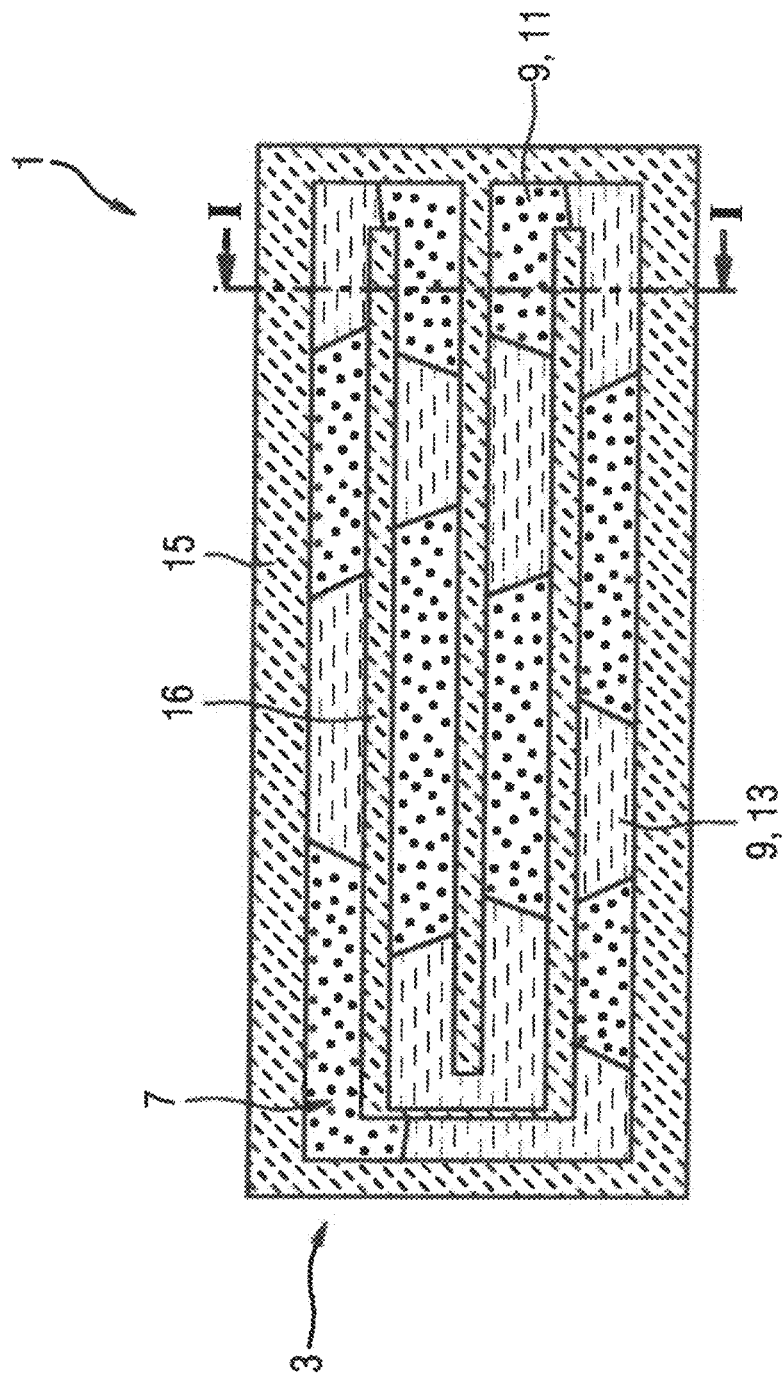
FIG. 2 shows the electronic module shown in FIG. 1 in a second sectional representation.

FIG. 1 (FIG. 1) and FIG. 2 (FIG. 2) show a first exemplary embodiment of an electronic module 1 according to the invention in two sectional representations with sectional planes that are orthogonal to one another. The electronic module 1 comprises a pulsating heat pipe 3 and an electrical structural element 5.

The pulsating heat pipe 3 has a planar channel structure 7, in which a heat transport medium 9 is arranged. The channel structure 7 is embodied as a closed channel running in a meandering manner. The heat transport medium 9 forms steam segments 11, in which the heat transport medium 9 is in a gaseous phase, and liquid segments 13, in which the heat transport medium 9 is in a gaseous phase, in an alternating manner along the channel. The steam segments 11 and liquid segments 13 are excited to pulsating or oscillating movements in the channel by way of temperature gradients. For example, the heat transport medium 9 is perfluoro-N-alkyl-morpholine.

The channel structure 7 is formed of two ceramic bodies 15, 16, an electrically conductive cover element 17 and a carrier element 18. The ceramic bodies 15, 16 form walls of the channel structure 7, which separate the channel sections of the channel from one another. The channel has a cross-section with a diameter of at most 1 mm, for example. The walls between adjacent channel sections that run in parallel with one another have a thickness of at most 0.1 mm, for example. Furthermore, a ceramic body 15 forms an outer frame of the channel structure 7. The cover element 17 closes off the channel structure 7 in the manner of a cover on one side of the pulsating heat pipe 3. The cover element 17 is made of copper, for example, and is embodied as a copper layer, copper plate or copper film. The carrier element 18 closes off the channel structure 7 on a side of the pulsating heat pipe 3 that is opposite the cover element 17. The carrier element 18 is also made of copper, for example, and is embodied as a copper layer, copper plate or copper film.

For example, the electrical structural element 5 is a power semiconductor, for example a MOSFET or an IGBT. The electrical structural element 5 is arranged on the cover element 17 and is connected to the cover element 17 in an electrically conductive manner and with a material fit by way of a solder connection 20. Below the electrical structural element 5, the cover element 17 is in direct contact with the heat transport medium 9 and, as a result, enables an effective conduction of heat from the electrical structural element 5 to the heat transport medium 9. The heat transport medium 9 absorbs heat generated by the electrical structural element 5, in particular in the form of latent heat due to the evaporation of liquid heat transport medium 9, and conducts the heat to a heat sink at another location of the channel structure 7, where the heat transport medium 9 emits heat, in particular in the form of latent heat due to the condensation of gaseous heat transport medium 9.

The cover element 17 has a filling opening 19, through which the channel structure 7 is filed with the heat transport medium 9. Once the channel structure 7 has been filled, the filling opening 19 is closed off with a filler material 21, for example by soldering or laser welding.

Figure 3:
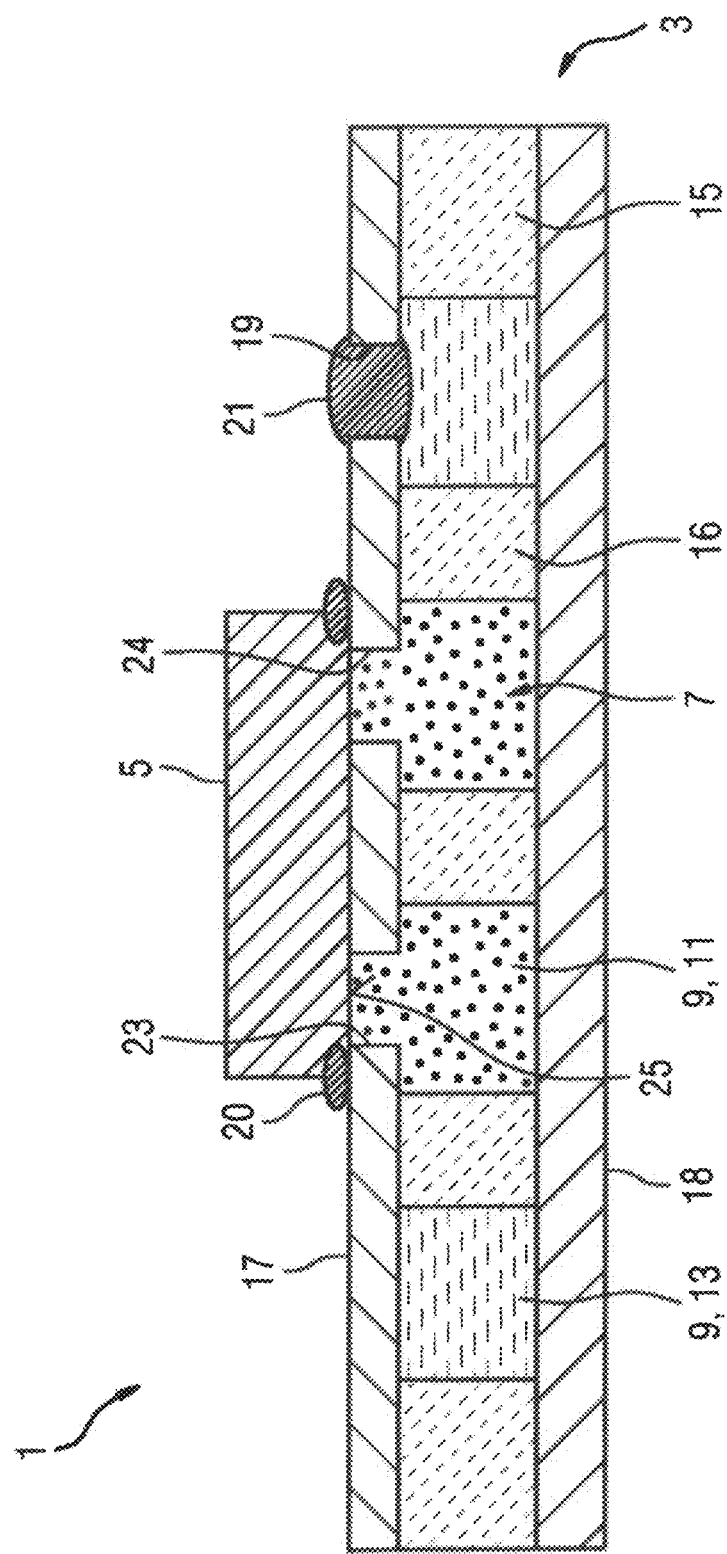
FIG. 3 shows a second exemplary embodiment of an electronic module in a sectional representation.

FIG. 3 (FIG. 3) shows a second exemplary embodiment of an electronic module 1 according to the invention in a sectional representation analogous to FIG. 1. This exemplary embodiment only differs from the exemplary embodiment shown in FIGS. 1 and 2 in that the cover element 17 has two recesses 23, 24 in the region of the electrical structural element 5, through which the channel structure 7 is connected to a surface 25 of the electrical structural element 5, meaning that the heat transport medium 9 is in direct contact with the surface 25.

Figure 4:
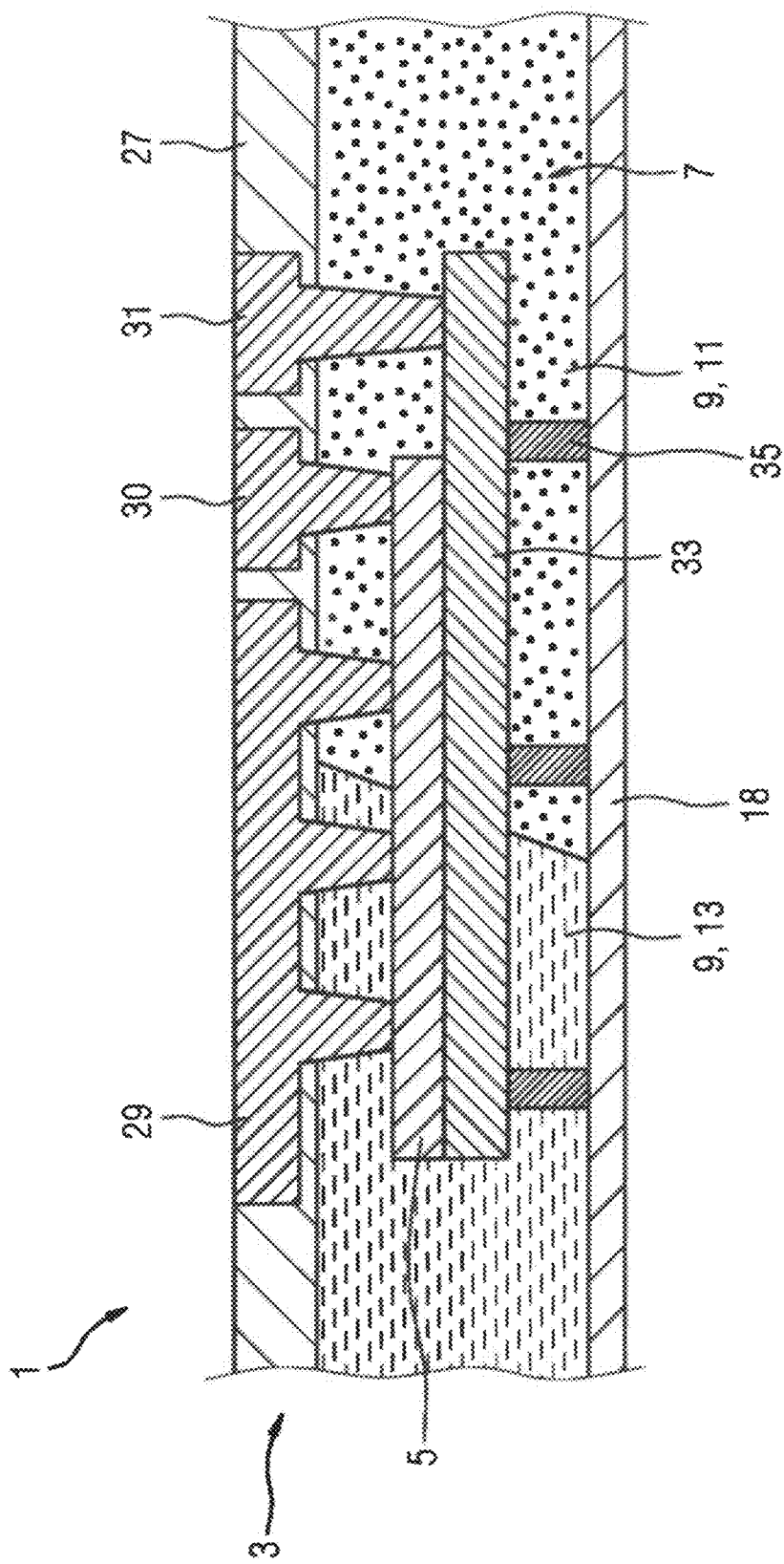
FIG. 4 shows a third exemplary embodiment of an electronic module in a sectional representation.

FIG. 4 (FIG. 4) shows a third exemplary embodiment of an electronic module 1 according to the invention in the region of an electrical structural element 5 in a sectional representation analogous to FIG. 1. As in the exemplary embodiments shown in FIGS. 1 to 3, the electronic module 1 has, in addition to the electrical structural element 5, a pulsating heat pipe 3 with a channel structure 7 and a heat transport medium 9 arranged in the channel structure 7 for absorbing heat generated by the electrical structural element 5 and for transporting it away. Unlike the exemplary embodiments shown in FIGS. 1 to 3, however, the electrical structural element 5 is arranged in the channel structure 7 of the pulsating heat pipe 3, meaning that the heat transport medium 9 flows around it. A further difference from the exemplary embodiments shown in FIGS. 1 to 3 is that the channel structure 7 is closed off by a circuit board 27 instead of by an electrically conductive cover element 17. The circuit board 27 has conductor paths 29, 30, 31, which are electrically connected to the electrical structural element 5. The electrical structural element 5 is arranged on an electrically conductive carrier 33, which is connected to the carrier element 18 by way of fastening pins 35 and is made of copper, for example. The carrier element 18 is made of a plastic, a ceramic material or a metal, for example.

The exemplary embodiments of an electronic module 1 according to the invention shown in the figures can be amended in various ways to form further exemplary embodiments. For example, the electronic module 1 instead of only one electrical structural element 5 may in each case have a plurality of electrical structural elements 5, which in each case are in thermal contact with the heat transport medium 9, via an electrically conductive cover element 17 as in FIG. 1, or directly as in FIG. 3 or 4, wherein it is also possible in particular for one or more of the electrical structural elements 5 to be in thermal contact with the heat transport medium 9 via a cover element 17, and for one or more of the electrical structural elements 5 to be in thermal contact with the heat transport medium 9 directly. Furthermore, the pulsating heat pipe 3 may be closed off on the bottom side by a ceramic body 15, 16, which also forms walls of the channel structure 7, instead of by a carrier element 18. In particular, the pulsating heat pipe 3 may have only one ceramic body 15, 16, which forms both the base and also the walls of the pulsating heat pipe 3. Alternatively, the pulsating heat pipe 3 may have more than only two ceramic bodies 15, 16, in particular in order to implement a geometrically complex channel structure 7. Furthermore, the exemplary embodiments shown in FIGS. 1 to 3 may be amended in that the channel structure 7 is closed off on the top side, only in regions, by at least one electrically conductive cover element 17, while other regions of the channel structure 7 are closed off in each case by an electrically insulating element or the ceramic body/bodies 15, 16 is/are designed as closed on the top side in these regions. Furthermore, the channel structure 7 may be embodied in a different manner than in FIG. 2. For example, the channel structure 7 may have a plurality of channels and/or one or more channels running in a star or rosette-like manner.

Alternatively to the exemplary embodiments shown in the figures, the heat pipe 3 may further have a closed base body made of a ceramic material, in which the channel structure 7 is embodied and on which at least one electrical structural element 5 is arranged.

Although the invention has been illustrated and described in detail on the basis of preferred exemplary embodiments, the invention is not restricted by the examples given and other variations can be derived therefrom by a person skilled in the art without departing from the protective scope of the invention.

What is claimed is:

1. An electronic module, comprising:
   a pulsating heat pipe including a channel structure for arrangement of a heat transport medium, said channel structure being formed of ceramic bodies, a metallic cover element, and a metallic carrier element; and
   an electrical structural element in direct contact with the heat transport medium.

2. The electronic module of claim 1, wherein the metallic cover element forms an electrically conductive contact element in direct contact with the heat transport medium, said electrical structural element being connected to the electrically conductive contact element.

3. The electronic module of claim 1, wherein the pulsating heat pipe is embodied in a plate-like manner.

4. The electronic module of claim 1, wherein the channel structure has a channel running in a meandering manner.

5. The electronic module of claim 1, wherein the channel structure is embodied in a planar manner.

6. The electronic module of claim 1, wherein at least one of the ceramic bodies forms a wall of the channel structure to separate channel sections of the channel structure from one another.

7. The electronic module of claim 1, wherein the metallic cover element is made of copper or an alloy.

8. The electronic module of claim 1, wherein the metallic carrier element is made of copper.

9. The electronic module of claim 1, wherein the heat transport medium is an electrically non-conductive fluid.

10. The electronic module of claim 1, wherein the heat transport medium is perfluoro-N-alkyl-morpholine.

11. The electronic module of claim 1, wherein the electrical structural element is a power semiconductor.

12. An electronic module, comprising:
a pulsating heat pipe including a channel structure for arrangement of a heat transport medium, said channel structure being formed of ceramic bodies, a metallic cover element, and a metallic carrier element; and
an electrical structural element in contact with the heat transport medium, wherein the metallic cover element is an electrically conductive contact element in contact with the heat transport medium, said electrical structural element being arranged on the metallic cover element, said metallic cover element being configured to close off the channel structure in a manner of a cover at least in a surrounding area of the electrical structural element, and including in a region of the electrical structural element a recess, through which the channel structure of the pulsating heat pipe is connected to a surface of the electrical structural element so that the heat transport medium is in direct contact with the surface of the electrical structural element.

13. An electronic module, comprising:
a pulsating heat pipe including a channel structure for arrangement of a heat transport medium said channel structure being formed of ceramic bodies, a metallic cover element and a metallic carrier element configured to close off the channel structure on a side opposite the metallic cover element; and
an electrical structural element in contact with the heat transport medium.

14. An electronic module, comprising:
a pulsating heat pipe Including a channel structure for arrangement of a heat transport medium, said channel structure being formed of ceramic bodies, a metallic cover element, and a metallic carrier element; and
an electrical structural element in contact with the heat transport medium, wherein the electrical structural element is arranged in the channel structure of the pulsating heat pipe such as to enable the heat transport medium to flow around the electrical structural element.

15. An electronic module, comprising:
a pulsating heat pipe including a channel structure for arrangement of a heat transport medium, said channel structure being formed of ceramic bodies a metallic cover element, and a metallic carrier element; and
an electrical structural element in contact with the heat transport medium, wherein the electrical structural element is arranged in channel structure, said pulsating heat pipe including a circuit board configured to close off at least a region of the channel structure in a manner of a cover, said circuit board including a conductor path which is electrically connected to the electrical structural element.

16. A method for producing an electronic module, said method comprising: mounting an electrical structural element to a pulsating heat pipe; filling a channel structure of the pulsating heat pipe through a filling opening of the channel structure with a heat transport medium which contacts the electrical structural element, with the channel structure formed of ceramic bodies, a metallic cover element, and a metallic carrier element configured to close off the channel structure on a side opposite the metallic cover element; and closing off the filling opening after filling of the channel structure with the heat transport medium.

17. The method of claim 16, further comprising at least partially producing the pulsating heat pipe by 3D printing.

* * * * *

UNITED STATES PATENT AND TRADEMARK OFFICE
CERTIFICATE OF CORRECTION

PATENT NO. : 12,322,675 B2  
APPLICATION NO. : 17/777443  
DATED : June 3, 2025  
INVENTOR(S) : Florian Schwarz, Alexander Hensler and Hubert Schierling Page 1 of 1

It is certified that error appears in the above-identified patent and that said Letters Patent is hereby corrected as shown below:

On the Title Page

Under item (72) Inventors:
Replace "Florian Schwarz, Bayern (DE)" with --Florian Schwarz, Fürth/Bayern (DE)--.

In the Claims

In Column 8, Claim 15, Line 21: Insert --the-- before "channel structure".

Signed and Sealed this
Fifteenth Day of July, 2025

Coke Morgan Stewart
*Acting Director of the United States Patent and Trademark Office*